United States Patent
Jeon et al.

(10) Patent No.: US 10,276,220 B2
(45) Date of Patent: Apr. 30, 2019

(54) ZQ CALIBRATION METHOD OF MEMORY DEVICE WITH SHARED ZQ PIN AND MEMORY DEVICE PERFORMING THE ZQ CALIBRATION METHOD

(71) Applicant: Samsung Electronics Co., Ltd., Suwon-si (KR)

(72) Inventors: Juho Jeon, Bucheon-si (KR); Hun-dae Choi, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/674,250

(22) Filed: Aug. 10, 2017

(65) Prior Publication Data

US 2018/0158495 A1 Jun. 7, 2018

(30) Foreign Application Priority Data

Dec. 1, 2016 (KR) .................. 10-2016-0162912

(51) Int. Cl.
  *G11C 7/10* (2006.01)
  *H01L 25/065* (2006.01)
  *G11C 29/02* (2006.01)

(52) U.S. Cl.
  CPC .......... *G11C 7/1057* (2013.01); *G11C 29/025* (2013.01); *G11C 29/028* (2013.01); *H01L 25/0657* (2013.01)

(58) Field of Classification Search
  None
  See application file for complete search history.

(56) References Cited

U.S. PATENT DOCUMENTS

| | | | |
|---|---|---|---|
| 7,528,626 B2 | 5/2009 | Kim | |
| 8,717,828 B2 | 5/2014 | Kim et al. | |
| 9,269,404 B1 | 2/2016 | Moran | |
| 2014/0167281 A1 | 6/2014 | Byeon | |
| 2014/0185384 A1 | 7/2014 | Kim et al. | |
| 2015/0067292 A1* | 3/2015 | Grunzke | G06F 13/1694 711/170 |
| 2015/0340069 A1 | 11/2015 | Arai et al. | |
| 2016/0012879 A1 | 1/2016 | Eom et al. | |
| 2016/0071568 A1 | 3/2016 | Sakai et al. | |
| 2016/0164521 A1 | 6/2016 | Chung et al. | |
| 2017/0228010 A1* | 8/2017 | Tatapudi | G06F 1/3225 |

FOREIGN PATENT DOCUMENTS

KR  10-0879747  1/2009

* cited by examiner

*Primary Examiner* — Seokjin Kim
(74) *Attorney, Agent, or Firm* — Muir Patent Law, PLLC

(57) ABSTRACT

A memory device configured to perform a ZQ calibration method may include a first die and a second die that share a resistor connected to a ZQ pin. The first die may be configured to perform a first calibration operation using the resistor in response to a ZQ calibration command applied from outside of the memory device. The first die may be configured to generate a ZQ flag signal after the first calibration operation ends and perform a second calibration operation. The second die may be configured to perform the first calibration operation in response to the ZQ flag signal and perform a second calibration after the first calibration operation of the second die ends.

16 Claims, 13 Drawing Sheets

ZQ CALIBRATION METHOD OF MEMORY DEVICE WITH SHARED ZQ PIN AND MEMORY DEVICE PERFORMING THE ZQ CALIBRATION METHOD

CROSS-REFERENCE TO RELATED APPLICATION

This application claims the benefit of Korean Patent Application No. 10-2016-0162912, filed on Dec. 1, 2016, in the Korean Intellectual Property Office, the disclosure of which is incorporated herein in its entirety by reference.

BACKGROUND

Various example embodiments relate to a semiconductor device, and more particularly, to a ZQ calibration method for retaining a calibration operation time in a memory device with a shared ZQ pin.

A swing width of signals is decreasing so as to minimize a transmission time of signals interfacing between semiconductor devices. As the swing width of the signals decreases, an effect of external noise on the semiconductor devices increases, and signal reflection that may be caused by impedance mismatching in an interface may be a serious problem. To solve the impedance mismatching, memory devices include ZQ pins to receive ZQ calibration commands from outside of the memory devices and perform ZQ calibration operations, thereby controlling impedance matching.

According to a trend of high capacity memory, a multichannel memory device may be provided in one package. The multichannel memory device includes a plurality of memory chips (or dies) independently operating through different channels. In the multichannel memory device, signal lines transmitting commands, addresses, and data for each memory chip configure a channel of each memory chip. Since the number of signal lines per channel causes overhead of a chip size, ZQ pins of memory chips may be shared in order to reduce the number of signal lines. In this case, a scheme for sufficiently retaining ZQ calibration operation time of each memory chips is useful during a period of time provided in a specification of the multichannel memory device.

SUMMARY

Some example embodiments provide a ZQ calibration method of a memory device with a shared ZQ pin.

Some example embodiments also provide a memory device performing the ZQ calibration method.

According to an aspect of the inventive concept, there is provided a ZQ calibration method performed by a memory device including a first die and a second die that share a resistor connected to a ZQ pin, the ZQ calibration method may include: performing a first calibration operation for the first die using the resistor in response to a ZQ calibration command applied from outside of the memory device; after the first calibration operation ends, generating a ZQ flag signal from the first die and performing a second calibration operation of the first die; performing a first calibration operation of the second die using the resistor in response to the ZQ flag signal; and after the first calibration operation of the first die ends, performing a second calibration of the second die.

According to another aspect of the inventive concept, there is provided a memory device including: a resistor, a first die including a first pad connected to the resistor, the first die configured to perform a first calibration operation based on the resistor in response to a ZQ calibration command, generate a ZQ flag signal when the first calibration operation is performed, and perform a second calibration operation; and a second die including a second pad connected to the resistor, the second die configured to perform a first calibration operation using the resistor in response to the ZQ flag signal and perform a second calibration operation.

According to another aspect of the inventive concept, there is provided an electronic device including: a first memory device comprising a first output driver connected to a resistor, and configured to perform a calibration operation using the resistor, and a second memory device comprising a second output driver connected to the resistor, and configured to perform a calibration operation using the resistor during the calibration operation of the first memory device. The first memory device is configured to adjust a resistance value of the first output driver during the calibration operation of the first memory device. The second memory device is configured to adjust a resistance value of the second output driver during the calibration operation of the second memory device.

BRIEF DESCRIPTION OF THE DRAWINGS

Exemplary embodiments will be more clearly understood from the following detailed description taken in conjunction with the accompanying drawings in which.

DETAILED DESCRIPTION

Various exemplary embodiments will be described more fully hereinafter with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items.

As used herein, a memory device may refer, for example, to a device such as a semiconductor chip (e.g., memory chip, memory die, and/or logic chip formed from a wafer), a stack of semiconductor chips, a semiconductor package including one or more semiconductor chips stacked on a package substrate, or a package-on-package device including a plurality of packages.

An electronic device, as used herein, may refer to one of these devices and may also include products that include these devices, such as a memory card, a memory module, a hard drive including additional components, a mobile phone, laptop, tablet, desktop, camera, server, computing system, or other consumer electronic device, etc.

Figure 1:
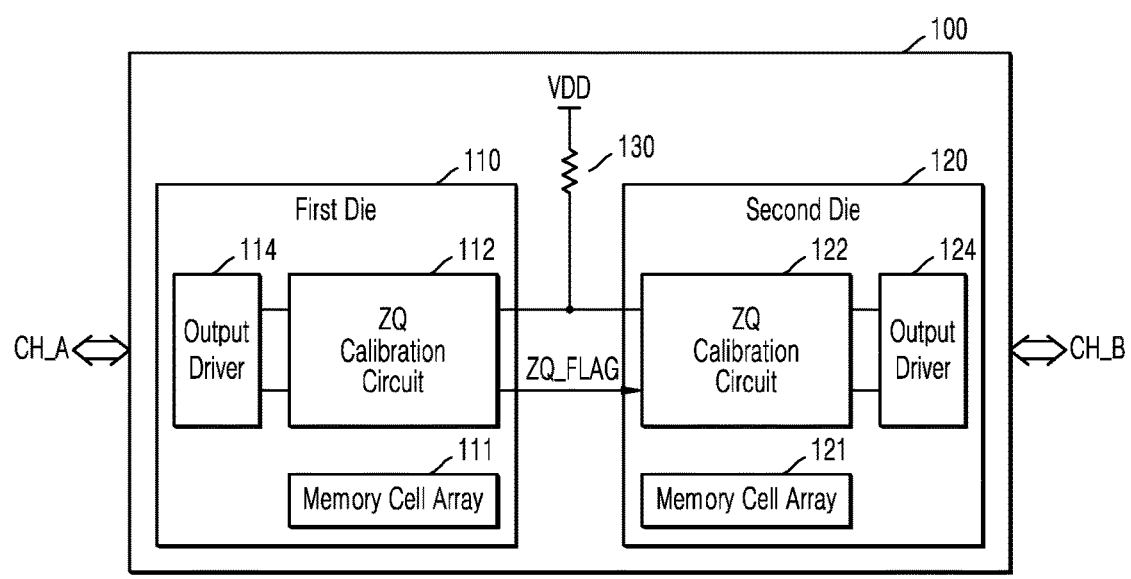
FIG. 1 is a block diagram of a multichannel memory device according to example embodiments.

FIG. 1 is a block diagram of a multichannel memory device 100 according to example embodiments.

Referring to FIG. 1, the multichannel memory device 100 may include a first die 110, a second die 120, and a resistor 130 that are packaged into one package. As an example, the package includes the first die 110, the second die 120, and the resistor 130 mounted on a substrate, and covered by an encapsulant. The first die 110 may function as a first chip and have a first channel CH_A. the second die 120 may function as a second chip and have a second channel CH_B. The resistor 130 may be used in a ZQ calibration operation for adjusting termination resistance values of the first and second dies 110 and 120. The resistor 130 may be, for example, 240Ω.

The first and second dies 110 and 120 may be mounted in the multichannel memory device 100 by using a package such as PoP (Package On Package), BGA (Ball Grid Arrays), CSP (Chip Scale Package), PLCC (Plastic Leaded Chip Carrier), PDIP (Plastic Dual In-line Package), Die in Waffle Pack, Die in Wafer Form, COB (Chip On Board), CERDIP (CERamic Dual In-line Package), MQFP (Metric Quad Flat Package), TQFP (Thin Quad FlatPack), Small Outline (SOIC), SSOP (Shrink Small Outline Package), TSOP (Thin Small Outline), SIP (System In Package), MCP (Multi Chip Package), WFP (Wafer-level Fabricated Package), WSP (Wafer-level processed Stack Package), etc.

In an embodiment, the die means an individual memory chip manufactured on a wafer. One die may be one memory chip. Two or more memory chips may be grouped to configure one multichannel memory device.

The first channel CH_A may include signal lines transmitting a command, an address, and data that are dedicated to the first die 110. The second channel CH_B may include signal lines transmitting a command, an address, and data that are dedicated to the second die 120.

The first and second channels CH_A and CH_B may be connected to a memory controller communicating with a central processing unit (CPU). The memory controller may transmit a write command and a read command that are received from the CPU to the multichannel memory device 100 through the first and second channels CH_A and CH_B. The memory controller may transmit a ZQ calibration command ZQ_CMD (shown in FIG. 2) to one of the first and second channels CH_A and CH_B. A case where the ZQ calibration command ZQ_CMD is transmitted to the first channel CH_A will be described in the present embodiments.

The first die 110 may include a first memory cell array 111, a first ZQ calibration circuit 112, and a first output driver 114.

Each of the first and second dies 110 and 120 may be implemented with any storage medium including a volatile memory or a nonvolatile memory. For example, each of the first and second dies 110 and 120 may include a volatile memory such as a dynamic random access memory (DRAM), a static RAM (SRAM), a thyristor RAM (TRAM), a zero capacitor RAM (Z-RAM), a twin transistor RAM (TTRAM), etc.

The first memory cell array 111 may include a plurality of memory cells such as DRAM cells, SRAM cells, MRAM cells, PRAM cells, RRAM cells, flash memory cells, etc. The DRAM memory cells may include one access transistor and one storage capacitor. The memory cells may be arranged in rows and columns of a matrix structure. The first die 110 may receive a command, address, and data through the first channel CH_A and output data read from the first memory cell array 111 through the first channel CH_A.

The first ZQ calibration circuit 112 may perform a ZQ calibration operation that generates a pull-up calibration code PCODE[0:N] (shown in FIGS. 2 and 3) and a pull-down calibration code NCODE[0:N] (shown in FIGS. 2 and 3) that adjust a termination resistance value of the first output driver 114 using the resistor 130. Herein, N may be a natural number equal to or greater than 1.

The second die 120 may be configured in the same way as the first die 110 and may include a second memory cell array 121, a second ZQ calibration circuit 122, and a second output driver 124. For example, the first die 110 and the second die 120 may be arranged in mirror die form.

The second die 120 may receive a command, an address, and data through the second channel CH_B and may output data read from the memory cell array 121 through the second channel CH_B. The second ZQ calibration circuit 122 may perform a ZQ calibration operation that generates a pull-up calibration code PCODE[0:N] and a pull-down calibration code NCODE[0:N] that adjusts a termination resistance value of the second output driver 124 using the resistor 130.

The first ZQ calibration circuit 112 of the first die 110 and the second ZQ calibration circuit 122 of the second die 120 may share the resistor 130. The resistor 130 may be a reference of the ZQ calibration operation. The resistor 130 may be shared by the first die 110 and the second die 120, and thus the number of signal lines of the first channel CH_A and the second channel CH_B may be reduced.

The first ZQ calibration circuit 112 may generate the pull-down calibration code NCODE[0:N] and the pull-up calibration code PCODE[0:N] of the first die 110 by trimming resistors 330, 340, and 350 (shown in FIG. 3) with respect to the resistor 130 in response to the ZQ calibration command ZQ_CMD (shown in FIG. 2) applied through the first channel CH_A.

The first ZQ calibration circuit 112 may generate a ZQ flag signal ZA_FLAG after a trimming operation for the pull-down calibration code NCODE[0:N]. The ZQ flag signal ZA_FLAG may be provided to the second ZQ calibration circuit 122.

The second ZQ calibration circuit 122 may generate the pull-down calibration code NCODE[0:N] and the pull-up calibration code PCODE[0:N] of the second die 120 by trimming the resistors 330, 340, and 350 with respect to the resistor 130 in response to the ZQ flag signal ZA_FLAG.

In example embodiments, the first ZQ calibration circuit 112 may generate the pull-down calibration code NCODE[0:N] of the first die 110 after generating the pull-up calibration code PCODE[0:N] in response to the ZQ calibration command ZQ_CMD. The first ZQ calibration circuit 112 may generate the ZQ flag signal ZA_FLAG after generating the pull-up calibration code PCODE[0:N] and provide the ZQ flag signal ZA_FLAG to the second ZQ calibration circuit 122. The second ZQ calibration circuit 122 may sequentially generate the pull-up calibration code PCODE[0:N] and the pull-down calibration code NCODE[0:N] of the second die 120 in response to the ZQ flag signal ZA_FLAG.

Figure 2:
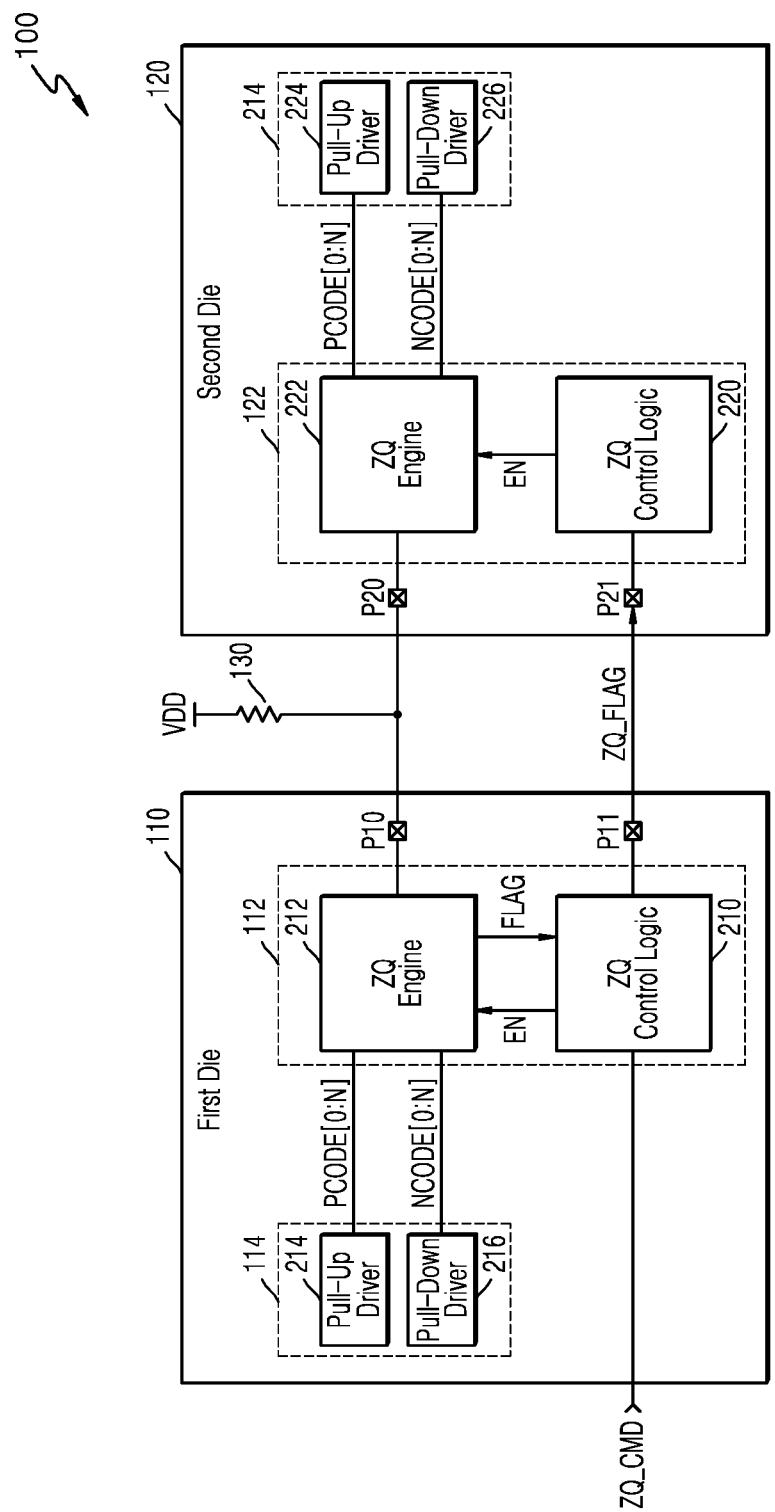
FIG. 2 is a diagram for explaining a detailed configuration of a ZQ calibration circuit of FIG. 1 according to example embodiments.

FIG. 2 is a diagram for explaining a detailed configuration of a ZQ calibration circuit of FIG. 1 according to example embodiments.

Referring to FIG. 2, the first ZQ calibration circuit 112 of the first die 110 may include a ZQ control logic 210 and a ZQ engine 212. The second ZQ calibration circuit 122 of the second die 120 may include a ZQ control logic 220 and a ZQ engine 222.

In the first die 110, the ZQ control logic 210 may receive the ZQ calibration command ZQ_CMD transmitted through the first channel CH_A and may provide one or more enable signals EN to the ZQ engine 212 in response to the ZQ calibration command ZQ_CMD. The ZQ engine 212 may be connected to the resistor 130 through a first pad P10 and may perform a ZQ calibration operation using the resistor 130 in response to the one or more enable signals EN.

The ZQ engine 212 may perform a pull-down calibration operation in response to the one or more enable signals EN to generate a pull-down calibration code NCODE[0:N] and may perform a pull-up calibration operation to generate a pull-up calibration code PCODE[0:N]. The ZQ engine 212 may generate a flag signal FLAG indicating that the pull-down calibration operation of generating the pull-down calibration code NCODE[0:N] ends.

According to other example embodiments, the ZQ engine 212 may generate the flag signal FLAG indicating that the pull-up calibration operation of generating the pull-up calibration code PCODE[0:N] ends (shown in FIGS. 7 to 10).

The pull-up calibration code PCODE[0:N] and the pull-down calibration code NCODE[0:N] of the first die 110 may be respectively provided to a first pull-up driver 214 and a pull-down driver 216 of the first output driver 114. As an example, the pull-up calibration code PCODE[0:N] and the pull-down calibration code NCODE[0:N] which are determined by the calibration operation may be stored in a register. In a normal read operation of the first die 110, the stored pull-up calibration code PCODE[0:N] and the pull-down calibration code NCODE[0:N] may be provided to the first pull-up driver 214 and a pull-down driver 216 of the first output driver 114. The flag signal FLAG may be provided to the ZQ control logic 210.

The ZQ control logic 210 may generate the ZQ flag signal ZQ_FLAG in response to the ZQ calibration command ZQ_CMD and the flag signal FLAG. The ZQ flag signal ZQ_FLAG may be transmitted to a third pad P21 of the second die 120 from a second pad P11 of the first die 110 through a signal line connected between the second pad P11 and the third pad P21.

In the second die 120, the ZQ control logic 220 may receive the ZQ calibration command ZQ_CMD transmitted through the third pad P21 and may provide one or more enable signals EN to the ZQ engine 222 in response to the ZQ flag signal ZQ_FLAG. In example embodiments, when the ZQ control logic 210 receives the ZQ calibration command ZQ_CMD the ZQ control logic 220 may provide the one or more enable signals EN to the ZQ engine 222 in response to the ZQ flag signal ZQ_FLAG without receiving the ZQ calibration command ZQ_CMD. The ZQ engine 222 may be connected to the resistor 130 through a fourth pad P20 and may perform the ZQ calibration operation on the resistor 130 in response to the one or more enable signals EN.

The ZQ engine 222 may perform a pull-down calibration operation to generate a pull-down calibration code NCODE[0:N] and may perform a pull-up calibration operation to generate a pull-up calibration code PCODE[0:N] in response to the one or more enable signals EN. The pull-up calibration code PCODE[0:N] and the pull-down calibration code NCODE[0:N] of the second die 120 may be respectively provided to a first pull-up driver 224 and a pull-down driver 226 of the second output driver 214.

An interconnection connected by wired may be present between the first pad P10 and the fourth pad P20 to which the resistor 130 is connected.

An interconnection connected by wired may be present between the second pad P11 and the third pad P21 that transfer the ZQ flag signal ZQ_FLAG. For example, an interconnection between the second pad P11 and the third pad P21 may be cut in wafers of the first and second dies 110 and 120 and then formed by using wire bonding or an interposer at a packaging process. According to example embodiments, the interconnection between the second pad P11 and the third pad P21 may be wirelessly implemented by using an optical I/O.

The multichannel memory device 100 may have to end the ZQ calibration operations of the first and second dies 110 and 120 during a period of time specified by a standard associated with the ZQ calibration command ZQ_CMD.

The first die 110 may perform a pull-down calibration operation and a pull-up calibration operation according to the ZQ calibration command ZQ_CMD to end the ZQ calibration operation of the first die 110. The first die 110 may generate and transfer the ZQ flag signal ZQ_FLAG to the second die 120 when the pull-down calibration operation of the first die 110 ends and perform the pull-up calibration operation of the first die 110.

The second die 120 may perform the pull-down calibration operation and the pull-up calibration operation in response to the ZQ flag signal ZQ_FLAG simultaneously with the pull-up calibration operation of the first die 110. As an example, second die 120 may perform the pull-down calibration operation during performing the pull-up calibration operation of the first die 110. The second die 120 may perform the pull-down calibration operation using the resistor 130 after completing the pull-down calibration operation of the first die 110 using the resistor 130.

In the multichannel memory device 100, when the pull-down calibration operation of the first die 110 ends using the resistor 130, the first die 110 may no longer need to use the resistor 130. In this regard, the second die 120 may perform the pull-down calibration operation using the resistor 130.

For example, let's assume that the ZQ calibration time specified by the standard is 1 us. If the ZQ calibration operation of the second die 120 is performed after the ZQ calibration operation of the first die 110 ends, a ZQ calibration operation time of the first die 110 and a ZQ calibration operation of the second die 120 may be limited to about 500 ns that is a half of the ZQ calibration time.

However, as a process, voltage, temperature (PVT) conditions of the multichannel memory device 100 is changed, the ZQ calibration operation time of each of the first die 110 and the second die 120 may be longer than 500 ns. In this case, the ZQ calibration operation time of each of the first die 110 and the second die 120 may not be properly performed.

In example embodiments, when the pull-down calibration operation of the first die 110 using the resistor 130 ends before the ZQ calibration operation of the first die 110 ends, the pull-down calibration operation of the second die 120 using the resistor 130 may start.

Figure 3:
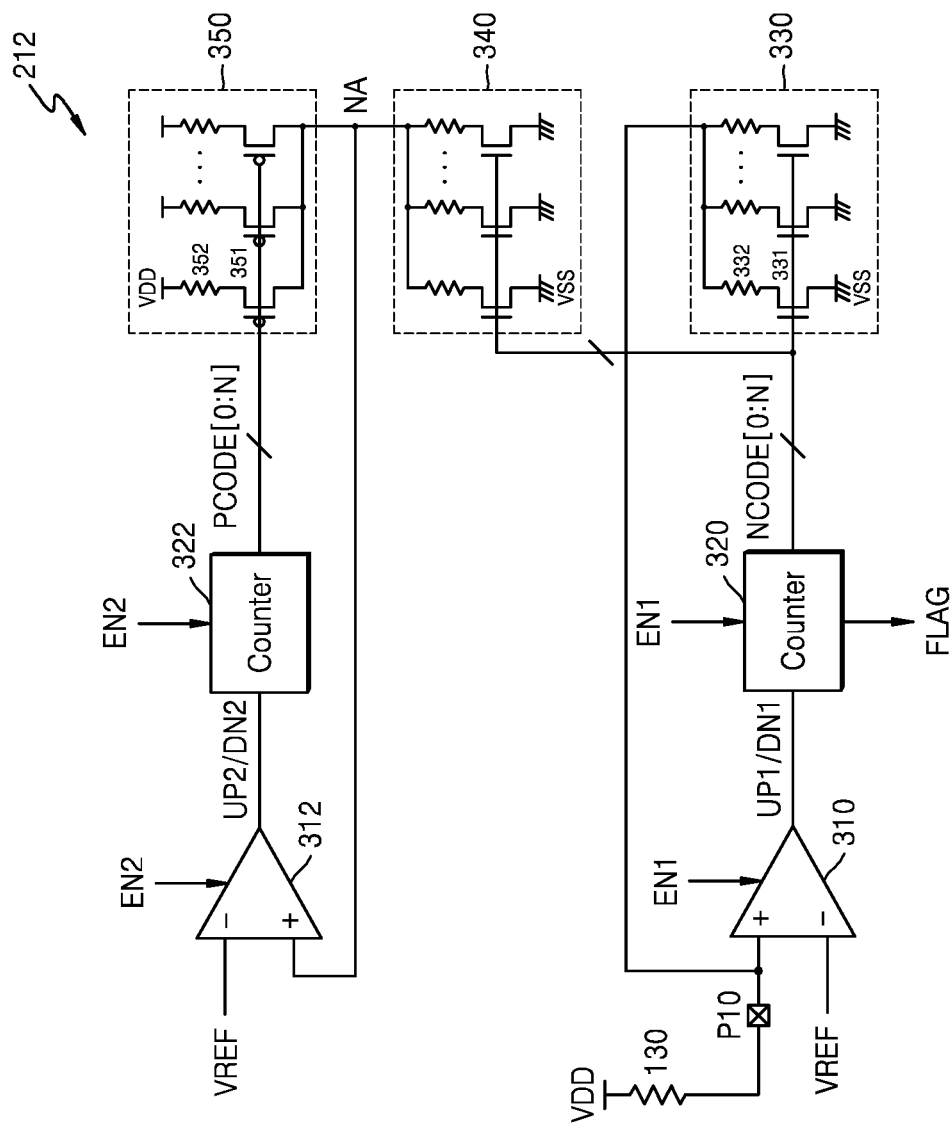
FIG. 3 is a circuit diagram of a ZQ engine of FIG. 2 according to example embodiments.

FIG. 3 is a circuit diagram of the ZQ engine 212 of FIG. 2 according to example embodiments.

Referring to FIG. 3, the ZQ engine 212 may include first and second comparators 310 and 312, first and second counters 320 and 322, a pull-down reference resistor 330, a dummy reference resistor 340, and a pull-up reference resistor 350. The ZQ engine 212 may be configured in the same way as the ZQ engine 222 of the second die 120. Resistance values of parallel resistors of the pull-down reference resistor 330, the dummy reference resistor 340, and the pull-up reference resistor 350 may be set in accordance with a binary weight.

The first comparator 310 may compare a voltage of the first pad P10 and a reference voltage VREF in response to a first enable signal EN1. The voltage of the first pad P10 may be a voltage generated by a voltage distribution of the resistor 130 and the pull-down reference resistor 330 connected between a power voltage VDD and a ground voltage VSS. The reference voltage VREF may be set as VDD/2.

The first comparator 310 may output a first up signal UP1 or a first down signal DN1 in response to the first enable signal EN1 and the voltage of the first pad P10. When the voltage of the first pad P10 is higher than the reference voltage VREF, the first comparator 310 may output the first up signal UP1. The first up signal UP1 may increase the pull-down calibration code NCODE[0:N] of the first counter 320, increase the number of NMOS transistors 331 that are turned on in the pull-down reference resistor 330, and increase the number of resistors 332 of the pull-down reference resistor 330. Due to an increase in the number of the resistors 332 that are connected in parallel with each other in the pull-down reference resistor 330, as a resistance value of the pull-down reference resistor 330 is reduced, a voltage level of the first pad P10 may be lowered. Such a pull-down calibration operation may be repeatedly performed until the voltage of the first pad P10 is lowered to be equal to the reference voltage VREF.

When the voltage of the first pad P10 is lower than the reference voltage VREF, the first comparator 310 may output the first down signal DN1. The first down signal DN1 may reduce the pull-down calibration code NCODE[0:N] of the first counter 320, reduce the number of the NMOS transistors 331 that are turned on in the pull-down reference resistor 330, and reduce the number of resistors 332 of the pull-down reference resistor 330. Due to a reduction in the number of the resistors 332 that are connected in parallel with each other in the pull-down reference resistor 330, as the resistance value of the pull-down reference resistor 330 is increased, the voltage level of the first pad P10 may be increased. Such a pull-down calibration operation may be repeatedly performed until the voltage of the first pad P10 is increased to be equal to the reference voltage VREF.

The first counter 320 may perform up/down count operations according to the first up/down signals UP1/DN1 of the first comparator 310 in response to the first enable signal EN1 and the voltage level of the first pad P10 to generate the pull-down calibration code NCODE[0:N]. As an example, the first counter 320 may perform up/down count operations according to the first up/down signals UP1/DN1 of the first comparator 310 in response to an enable signal other than the first enable signal EN1. The first counter 320 may provide the pull-down calibration code NCODE[0:N] to the pull-down reference resistor 330 and the dummy reference resistor 340. The first counter 320 may generate a flag signal FLAG when the pull-down calibration operation of the first die 110 ends. The flag signal FLAG may be provided to the ZQ control logic 210 (shown in FIG. 2).

The dummy reference resistor 340 may be configured in the same way as the pull-down reference resistor 330 and may have the same resistance value as that of the pull-down reference resistor 330 in response to the pull-down calibration code NCODE[0:N].

The second comparator 312 may compare a voltage of a first node NA and the reference voltage VREF in response to a second enable signal EN2 and output second up/down signals UP2/DN2 according to a comparison result. As an example, the second enable signal EN2 may be activated after the first enable signal EN1 is deactivated. The voltage of the first node NA may be voltage generated by a voltage distribution of the pull-up reference resistor 350 and the dummy reference resistor 340.

When the voltage of the first node NA is lower than the reference voltage VREF, the second comparator 312 may output the second down signal DN2. The second down signal DN2 may reduce the pull-up calibration code PCODE[0:N] of the second counter 322, increase the number of PMOS transistors 351 that are turned on in the pull-up reference resistor 350, and increase the number of resistors 352 of the pull-up reference resistor 350. Due to an increase in the number of the resistors 352 that are connected in parallel with each other in the pull-up reference resistor 350, as a resistance value of the pull-up reference resistor 350 is reduced, a voltage level of the first node NA may be increased. Such a pull-up calibration operation may be repeatedly performed until the voltage of the first node NA is increased to be equal to the reference voltage VREF.

When the voltage of the first node NA is higher than the reference voltage VREF, the second comparator 312 may output the second up signal UP2. The second up signal UP2 may increase the pull-up calibration code PCODE[0:N] of the second counter 322, reduce the number of the PMOS transistors 351 that are turned on in the pull-up reference resistor 350, and reduce the number of resistors 352 of the pull-up reference resistor 350. Due to a reduction in the number of the resistors 352 that are connected in parallel with each other in the pull-up reference resistor 350, as the resistance value of the pull-up reference resistor 350 is increased, the voltage level of the first node NA may be lowered. Such a pull-up calibration operation may be repeatedly performed until the voltage of the first node NA is lowered to be equal to the reference voltage VREF.

The second counter 322 may perform up/down count operations according to the second up/down signals UP2/DN2 of the second comparator 312 in response to the second enable signal EN2 and the voltage of the node NA to generate the pull-up calibration code PCODE[0:N]. As an example, the second counter 322 may perform up/down count operations according to the second up/down signals UP2/DN2 of the second comparator 312 in response to an enable signal other than the second enable signal EN2.

The pull-down calibration code NCODE[0:N] and the pull-up calibration code PCODE[0:N] that are generated through the above-described pull-down calibration operation and pull-up calibration operation may be used to adjust on-resistance values or on-die termination values of the output driver 114 of the first die 110. As an example, the first node NA may be connected to the output driver 114.

Figure 4:
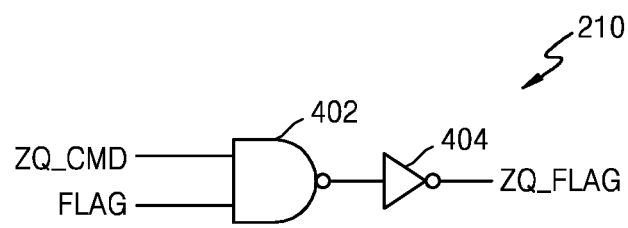
FIG. 4 is a circuit diagram of a part of a ZQ control logic of FIG. 2 according to example embodiments.

FIG. 4 is a circuit diagram of a part of the ZQ control logic 210 of FIG. 2 according to example embodiments.

Referring to FIG. 4, the ZQ control logic 210 may input the ZQ calibration command ZQ_CMD applied to the first channel CH_A and the flag signal FLAG provided by the ZQ engine 212 to generate the ZQ flag signal ZQ_FLAG. The ZQ control logic 210 may include a NAND gate 402 that inputs the ZQ calibration command ZQ_CMD and the flag signal FLAG and an inverter 404 that inputs an output of the NAND gate 402 and outputs the ZQ flag signal ZQ_FLAG.

Figure 5:
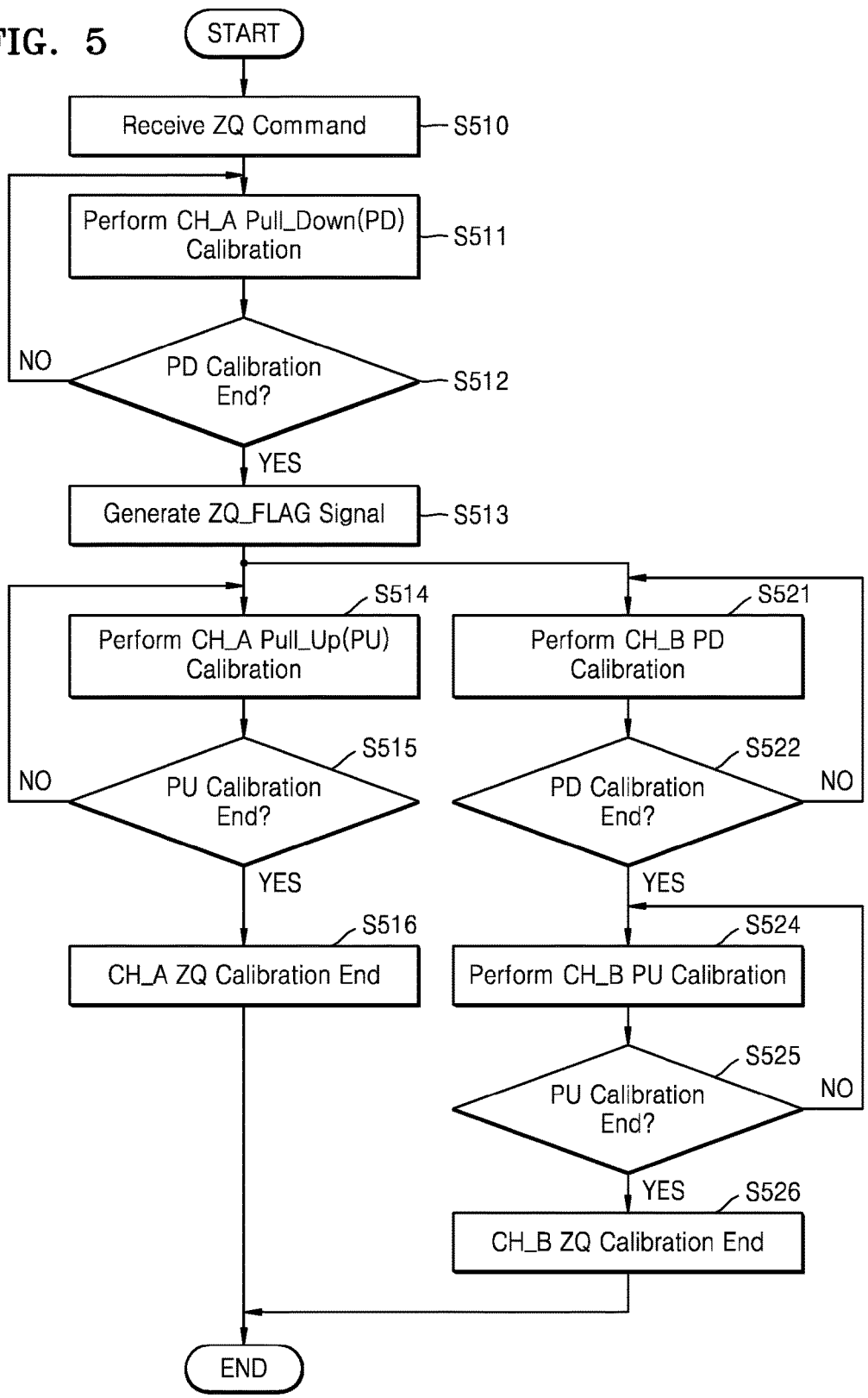
FIG. 5 is a flowchart of a ZQ calibration method according to example embodiments.

FIG. 5 is a flowchart of a ZQ calibration operation method according to at example embodiments.

Referring to FIGS. 2 to 5, the ZQ calibration command ZQ_CMD that instructs a ZQ calibration operation may be received (operation S510). A pull-down calibration operation is performed in the first die 110 of the first channel CH_A that receives the ZQ calibration command ZQ_CMD (operation S511). It may be checked whether the pull-down calibration operation of the first die 110 ends (operation S512).

In operation S512, when the pull-down calibration operation of the first die 110 does not end, operation S511 may be performed again. When the pull-down calibration operation of the first die 110 ends, in operation S513, the ZQ flag signal ZQ_FLAG may be generated. The ZQ flag signal ZQ_FLAG may be provided to the second die 120 and then operation S521 may be performed.

When the ZQ flag signal ZQ_FLAG is generated, a pull-up calibration operation may be performed in the first die 110 (operation S514). It may be checked whether the pull-up calibration operation of the first die 110 ends (operation S515).

In operation S515, when the pull-up calibration operation of the first die 110 does not end, operation S514 may be performed again. When the pull-up calibration operation of the first die 110 ends, a ZQ calibration operation of the first die 110 of the first channel CH_A may end (operation S516).

A pull-down calibration operation may be performed in the second die 120 of the second channel CH_B in response to the ZQ flag signal ZQ_FLAG (operation S521). It may be checked whether the pull-down calibration operation of the second die 120 ends (operation S522).

In operation S522, when the pull-down calibration operation of the second die 120 does not end, operation S521 may be performed again. When the pull-down calibration operation of the second die 120 ends, a pull-up calibration operation of the second die 120 may be performed (operation S524). It may be checked whether the pull-up calibration operation of the second die 120 ends (operation S525).

In operation S525, when the pull-up calibration operation of the second die 120 does not end, operation S524 may be performed again. When the pull-up calibration operation of the second die 120 ends, a ZQ calibration operation of the second die 120 of the second channel CH_B may end (operation S526).

In the present embodiment, when the pull-down calibration operation of the first die 110 ends by applying the ZQ calibration command ZQ_CMD to the first channel CH_A, the pull-down calibration operation of the second die 120 may be performed. According to another embodiment, the ZQ calibration command ZQ_CMD may be applied to the second channel CH_B. In this case, when the pull-down calibration operation of the second die 120 ends, the ZQ flag signal ZQ_FLAG may be generated and provided to the first die 110, and the pull-down calibration operation of the first die 110 may be performed.

Figure 6:
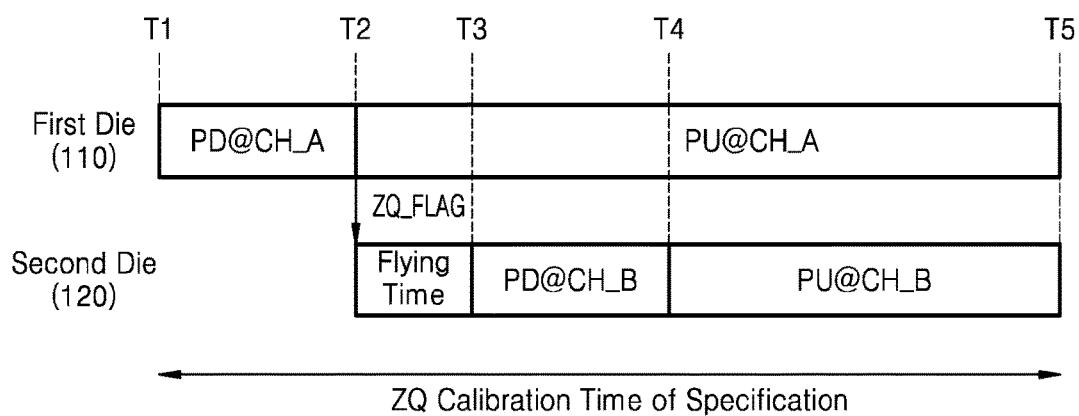
FIG. 6 is a timing diagram of a ZQ calibration operation according to example embodiments.

FIG. 6 is a timing diagram of a ZQ calibration operation according to example embodiments.

Referring to FIG. 6, at a time T1, the first die 110 of the first channel CH_A may start a pull-down calibration operation in response to the ZQ command ZQ_CMD. At a time T2, the first die 110 may end the pull-down calibration operation, generate the ZQ flag signal ZQ_FLAG, and start a pull-up calibration operation.

After a flying time during which the ZQ flag signal ZQ_FLAG is transmitted from the first die 110 to the second die 120 from the time T2, at a time T3, the second die 120 of the second channel CH_B may start the pull-down calibration operation in response to the ZQ flag signal ZQ_FLAG. At a time T4, the second die 120 may end the pull-down calibration operation and start the pull-up calibration operation. At a time T5, the first die 110 and the second die 120 may end the pull-up calibration operation. The pull-up calibration operation of the first die 110 may start at the time T2 before the pull-down calibration operation of the second die 120 starts. The pull-up calibration operation of the first die 110 may end before the time T5. The pull-down calibration operation and the pull-up operation of the second die 120 may overlap with the pull-up calibration operation of the first die 110. Thus, each of the first and second dies 110 and 120 may have a sufficient time for the calibration operation by overlapping of the calibration operation of each of the first and second dies 110 and 120.

Figure 7:
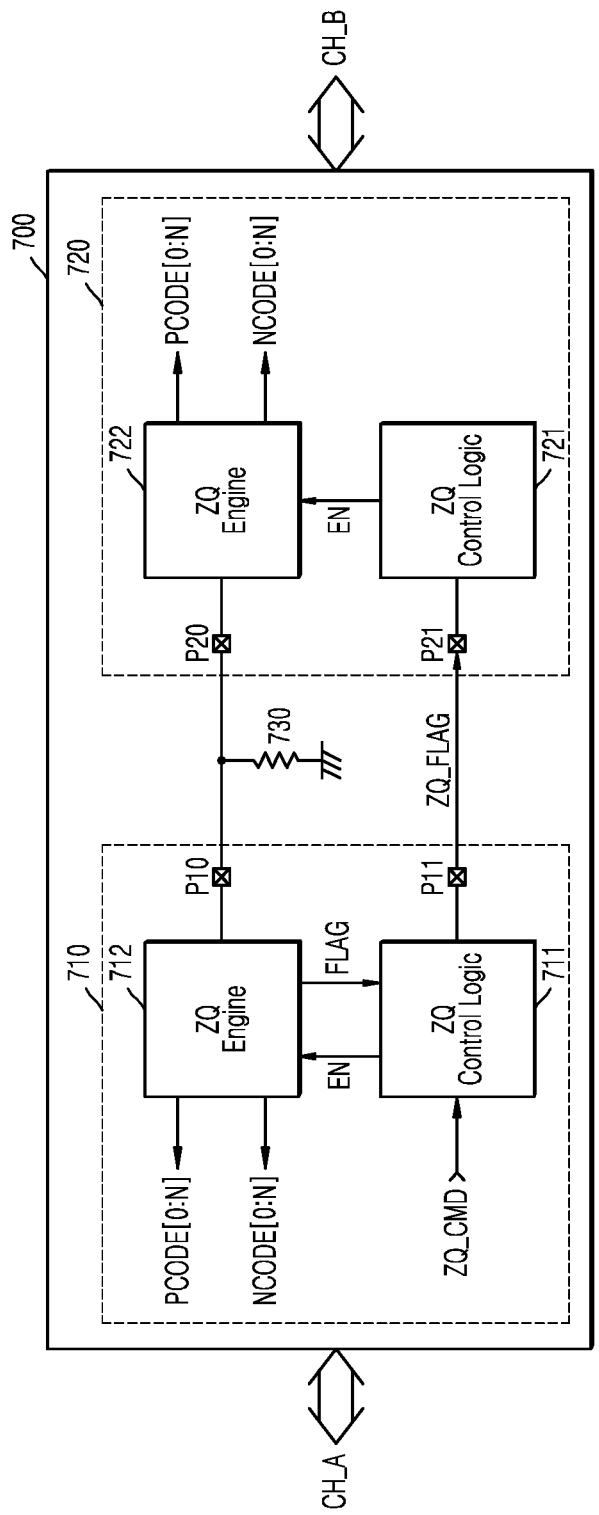
FIG. 7 is a block diagram of a multichannel memory device according to other example embodiments.

FIG. 7 is a block diagram of a multichannel memory device 700 according to other example embodiments.

Referring to FIG. 7, the multichannel memory device 700 may perform a ZQ calibration operation with a pull-up calibration operation first, whereas the multichannel memory device 100 of FIG. 1 performs the ZQ calibration operation with a pull-down calibration operation first. To perform the ZQ calibration operation with the pull-up calibration operation first, the multichannel memory device 700 may connect a resistor 730 connected to a first pad P10 and a fourth pad P20 to the ground voltage VSS.

The multichannel memory device 700 may include a first die 710, a second die 720, and the resistor 730 that are packaged into one package. The first die 710 may include a ZQ control logic 711 and a ZQ engine 712. The second die 720 may include a ZQ control logic 721 and a ZQ engine 722.

In the first die 710, the ZQ control logic 711 may receive the ZQ calibration command ZQ_CMD transmitted through a first channel CH_A and may provide one or more enable signals EN to the ZQ engine 712 in response to the ZQ calibration command ZQ_CMD. The ZQ engine 712 may be connected to the resistor 730 through the first pad P10 and may perform a ZQ calibration operation using the resistor 730 in response to the one or more enable signals EN.

The ZQ engine 712 may perform a pull-up calibration operation in response to the one or more enable signals EN to generate a pull-up calibration code PCODE[0:N] and may perform a pull-down calibration operation to generate a pull-down calibration code NCODE[0:N]. The ZQ engine 712 may generate a flag signal FLAG indicating that the pull-up calibration operation of generating the pull-up calibration code PCODE[0:N] ends.

The flag signal FLAG may be provided to the ZQ control logic 711. The ZQ control logic 711 may generate a ZQ flag signal ZQ_FLAG in response to the ZQ calibration command ZQ_CMD and the flag signal FLAG. The ZQ flag signal ZQ_FLAG may be transmitted to a third pad P21 of the second die 720 through a second pad P11 of the first die 710.

In the second die 720, the ZQ control logic 721 may receive the ZQ calibration command ZQ_CMD transmitted through the third pad P21 and may provide one or more enable signals EN to the ZQ engine 722 in response to the ZQ flag signal ZQ_FLAG. In example embodiments, when the ZQ control logic 711 receives the ZQ calibration command ZQ_CMD the ZQ control logic 721 may provide the one or more enable signals EN to the ZQ engine 722 in response to the ZQ flag signal ZQ_FLAG without receiving the ZQ calibration command ZQ_CMD.

The ZQ engine 722 may be connected to the resistor 730 through the fourth pad P20 and may perform the ZQ calibration operation on the resistor 730 in response to the one or more enable signals EN. The ZQ engine 722 may perform a pull-up calibration operation to generate a pull-up calibration code PCODE[0:N] and may perform a pull-down calibration operation to generate a pull-down calibration code NCODE[0:N].

Figure 8:
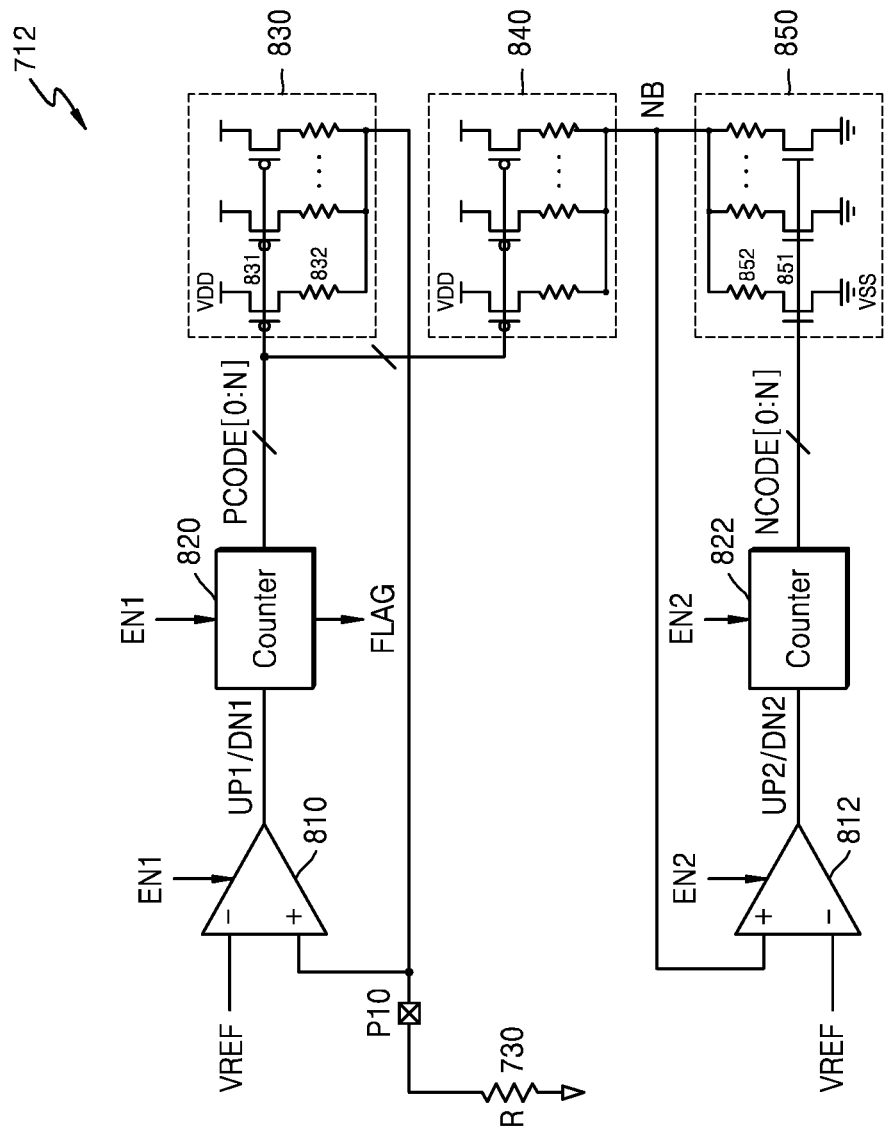
FIG. 8 is a circuit diagram of a ZQ engine of FIG. 7 according to example embodiments.

FIG. 8 is a circuit diagram of the ZQ engine 712 of FIG. 7 according to example embodiments.

Referring to FIG. 8, the ZQ engine 712 may include first and second comparators 810 and 812, first and second counters 820 and 822, a pull-up reference resistor 830, a dummy reference resistor 840, and a pull-down reference resistor 850. The ZQ engine 712 may be configured in the same way as the ZQ engine 722 of the second die 720. Resistance values of parallel resistors of the pull-up reference resistor 830, the dummy reference resistor 840, and the pull-down reference resistor 850 may be set in accordance with a binary weight.

The first comparator 810 may compare a voltage of the first pad P10 and the reference voltage VREF in response to a first enable signal EN1. The voltage of the first pad P10 may be a voltage generated by a voltage distribution of the resistor 830 and the pull-up reference resistor 830 connected between the power voltage VDD and the ground voltage VSS. The reference voltage VREF may be set as VDD/2.

The first comparator 810 may output the first up signal UP1 or the first down signal DN1 in response to the first enable signal EN1 and the voltage of the first pad P10. When the voltage of the first pad P10 is higher than the reference voltage VREF, the first comparator 810 may output the first up signal UP1. The first up signal UP1 may increase the pull-up calibration code PCODE[0:N] of the first counter 820, increase the number of PMOS transistors 831 that are turned off in the pull-up reference resistor 830, and reduce the number of resistors 832 of the pull-up reference resistor 830. Due to a reduction in the number of the resistors 832 that are connected in parallel with each other in the pull-up reference resistor 830, as a resistance value of the pull-up reference resistor 830 is increased, the voltage level of the first pad P10 is connected may be lowered. Such a pull-up calibration operation may be repeatedly performed until the voltage of the first pad P10 is lowered to be equal to the reference voltage VREF.

When the voltage of the first pad P10 is lower than the reference voltage VREF, the first comparator 810 may output the first down signal DN1. The first down signal DN1 may reduce the pull-up calibration code PCODE[0:N] of the first counter 820, increase the number of the PMOS transistors 831 that are turned on in the pull-up reference resistor 830, and increase the number of resistors 832 of the pull-up reference resistor 830. Due to an increase in the number of the resistors 832 that are connected in parallel with each other in the pull-up reference resistor 830, as the resistance value of the pull-up reference resistor 830 is reduced, the voltage level of the first pad P10 is connected may be increased. Such a pull-up calibration operation may be repeatedly performed until the voltage of the first pad P10 is increased to be equal to the reference voltage VREF.

The first counter 820 may perform up/down count operations according to the first up/down signals UP1/DN1 of the first comparator 810 in response to the first enable signal EN1 and the voltage level of the first pad P10 to generate the pull-up calibration code PCODE[0:N]. As an example, the first counter 820 may perform up/down count operations according to the first up/down signals UP1/DN1 of the first comparator 810 in response to an enable signal other than the first enable signal EN1. The first counter 820 may provide the pull-up calibration code PCODE[0:N] to the pull-up reference resistor 830 and the dummy reference resistor 840. The first counter 820 may generate a flag signal FLAG when the pull-up calibration operation of the first die 710 ends. The flag signal FLAG may be provided to the ZQ control logic 711.

The dummy reference resistor 840 may be configured in the same way as the pull-up reference resistor 830 and may have the same resistance value as that of the pull-up reference resistor 830 in response to the pull-up calibration code PCODE[0:N].

The second comparator 812 may compare a voltage of a second node NB and the reference voltage VREF in response to a second enable signal EN2 and output the second up/down signals UP2/DN2 according to a comparison result. As an example, the second enable signal EN2 may be activated after the first enable signal EN1 is deactivated. The voltage of the second node NB may be a voltage generated by a voltage distribution of the dummy reference resistor 840 and the pull-down reference resistor 850.

When the voltage of the second node NB is lower than the reference voltage VREF, the second comparator 812 may output the second down signal DN2. The second down signal DN2 may reduce the pull-down calibration code NCODE[0:N] of the second counter 822, reduce the number of NMOS transistors 851 that are turned on in the pull-down reference resistor 850, and reduce the number of resistors 852 of the pull-down reference resistor 850. Due to a reduction in the number of the resistors 852 that are connected in parallel with each other in the pull-down reference resistor 850, as a resistance value of the pull-down reference resistor 850 is increased, a voltage level of the second node NB is connected may be increased. Such a pull-down calibration operation may be repeatedly performed until the voltage of the second node NB is increased to be equal to the reference voltage VREF.

When the voltage of the second node NB is higher than the reference voltage VREF, the second comparator 812 may output the second up signal UP2. The second up signal UP2 may increase the pull-down calibration code NCODE[0:N] of the second counter 822, increase the number of the NMOS transistors 851 that are turned on in the pull-down reference resistor 850, and increase the number of resistors 852 of the pull-down reference resistor 850. Due to an increase in the number of the resistors 852 that are connected in parallel with each other in the pull-up reference resistor 350, as the resistance value of the pull-down reference resistor 850 is reduced, the voltage level of the second node NB may be lowered. Such a pull-down calibration operation may be repeatedly performed until the voltage of the second node NB is lowered to be equal to the reference voltage VREF.

The second counter 822 may perform up/down count operations according to the second up/down signals UP2/DN2 of the second comparator 812 in response to the second enable signal EN2 to generate the pull-down calibration code NCODE[0:N]. As an example, the second counter 822 may perform up/down count operations according to the second up/down signals UP2/DN2 of the second comparator 812 in response to an enable signal other than the second enable signal EN2.

The pull-down calibration code NCODE[0:N] and the pull-up calibration code PCODE[0:N] that are respectively generated through the pull-down calibration operation and the pull-up calibration operation of the first and second dies 710 and 712 described above may be used to adjust on-resistance values or on-die termination values of output drivers of the first and second dies 710 and 712.

Figure 9:
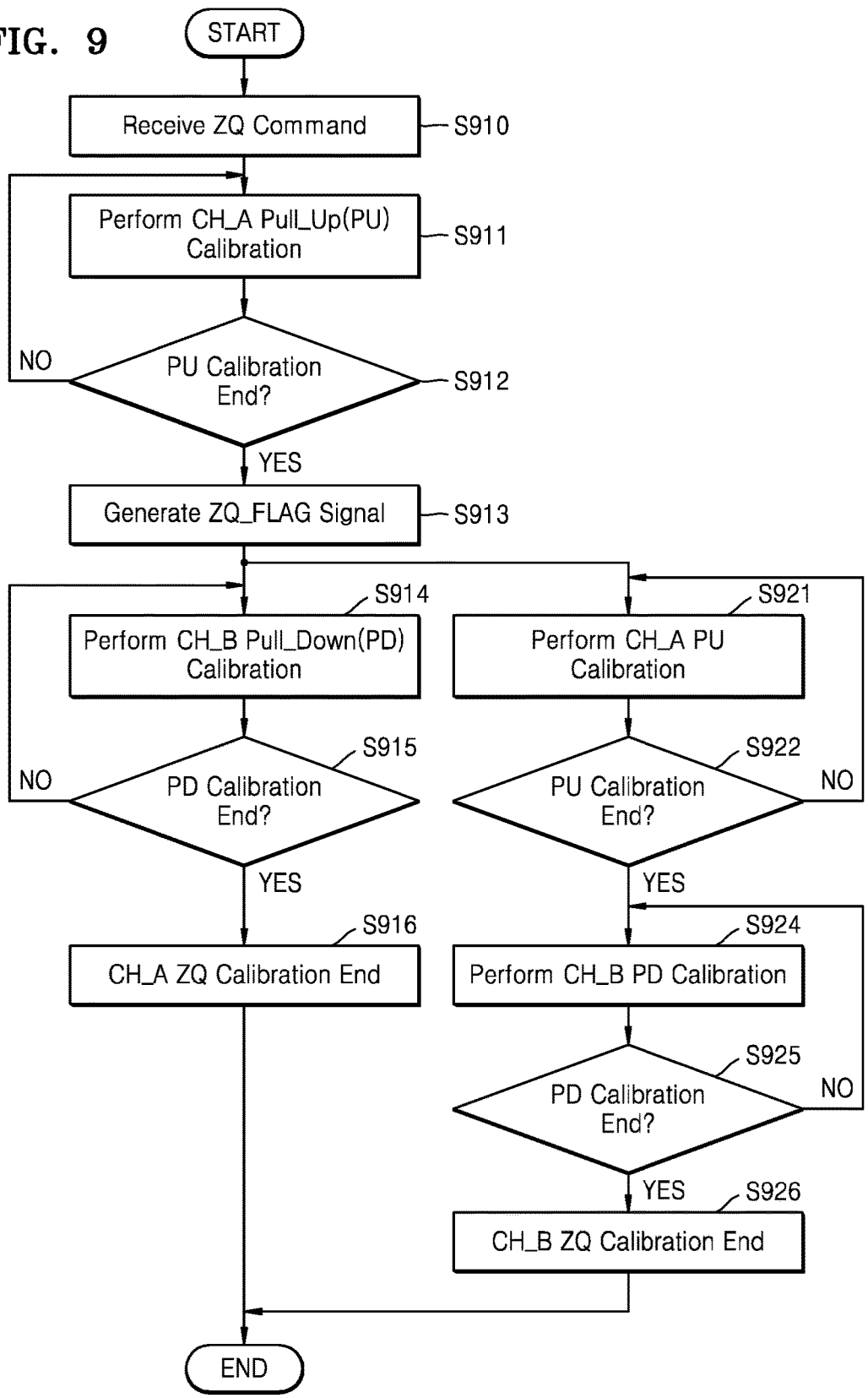
FIG. 9 is a flowchart of a ZQ calibration method in association with FIG. 8 according to example embodiments.

FIG. 9 is a flowchart of a ZQ calibration method in association with FIG. 8 according to example embodiments.

Referring to FIGS. 7, 8, and 9, the ZQ calibration command ZQ_CMD that instructs a ZQ calibration operation may be received (operation S910). A pull-up calibration operation is performed in the first die 710 of the first channel CH_A that receives the ZQ calibration command ZQ_CMD (operation S911). It may be checked whether the pull-up calibration operation of the first die 710 ends (operation S912).

In operation S912, when the pull-up calibration operation of the first die 710 does not end, operation S911 may be performed again. When the pull-up calibration operation of the first die 710 ends, in operation S913, the ZQ flag signal ZQ_FLAG may be generated. The ZQ flag signal ZQ_FLAG may be provided to the second die 720 and then operation S921 may be performed.

When the ZQ flag signal ZQ_FLAG is generated, a pull-down calibration operation may be performed in the first die 710 (operation S914). It may be checked whether the pull-down calibration operation of the first die 710 ends (operation S915).

In operation S915, when the pull-down calibration operation of the first die 710 does not end, operation S914 may be performed again. When the pull-down calibration operation of the first die 710 ends, a ZQ calibration operation of the first die 710 of the first channel CH_A may end (operation S916).

A pull-up calibration operation may be performed in the second die 720 of the first channel CH_A in response to the ZQ flag signal ZQ_FLAG (operation S921). It may be checked whether the pull-up calibration operation of the second die 720 ends (operation S922).

In operation S922, when the pull-up calibration operation of the second die 720 does not end, operation S921 may be performed again. When the pull-up calibration operation of the second die 720 ends, a pull-down calibration operation of the second die 720 may be performed (operation S924). It may be checked whether the pull-down calibration operation of the second die 720 ends (operation S925).

In operation S925, when the pull-down calibration operation of the second die 720 does not end, operation S924 may be performed again. When the pull-down calibration operation of the second die 720 ends, a ZQ calibration operation of the second die 720 of the first channel CH_A may end (operation S926).

In the present embodiment, if the pull-up calibration operation of the first die 710 ends by applying the ZQ calibration command ZQ_CMD to the first channel CH_A, the pull-up calibration operation of the second die 720 may be performed. According to another embodiment, the ZQ calibration command ZQ_CMD may be applied to the second channel CH_B. In this case, when the pull-up calibration operation of the second die 720 ends, the ZQ flag signal ZQ_FLAG may be generated and provided to the first die 710, and the pull-up calibration operation of the first die 710 may be performed.

Figure 10:
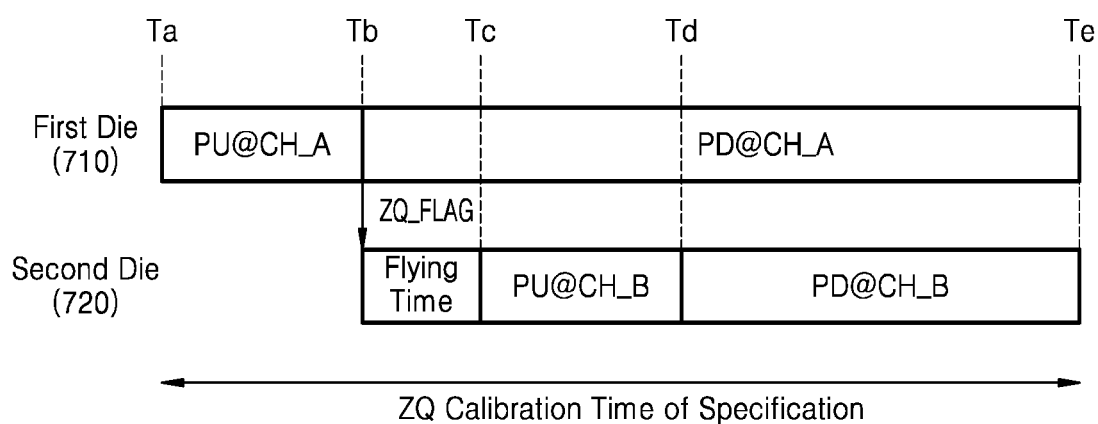
FIG. 10 is a timing diagram of a ZQ calibration operation of FIG. 9 according to example embodiments.

FIG. 10 is a timing diagram of a ZQ calibration operation of FIG. 9 according to example embodiments.

Referring to FIG. 10, at a time Ta, the first die 710 of the first channel CH_A may start a pull-up calibration operation in response to the ZQ command ZQ_CMD. At a time Tb, the first die 710 may end the pull-up calibration operation, generate the ZQ flag signal ZQ_FLAG, and start a pull-down calibration operation.

After a flying time during which the ZQ flag signal ZQ_FLAG is transmitted from the first die 710 to the second die 720 from the time Tb, at a time Tc, the second die 720 of the second channel CH_B may start the pull-up calibration operation in response to the ZQ flag signal ZQ_FLAG. At a time Td, the second die 720 may end the pull-up calibration operation and start the pull-down calibration operation. At a time Te, the first die 710 and the second die 720 may end the pull-up calibration operation. The pull-down operation of the first die 710 may start at the time Tb before the pull-up calibration operation of the second die 720 starts. The pull-down calibration operation of the first die 710 may end before the time Te. The pull-up calibration operation and the pull-down operation of the second die 720 may overlap with the pull-down calibration operation of the first die 710. Thus, each of the first and second dies 710 and 720 may have a sufficient time for the calibration operation by overlapping of the calibration operation of each of the first and second dies 710 and 720.

Figure 11:
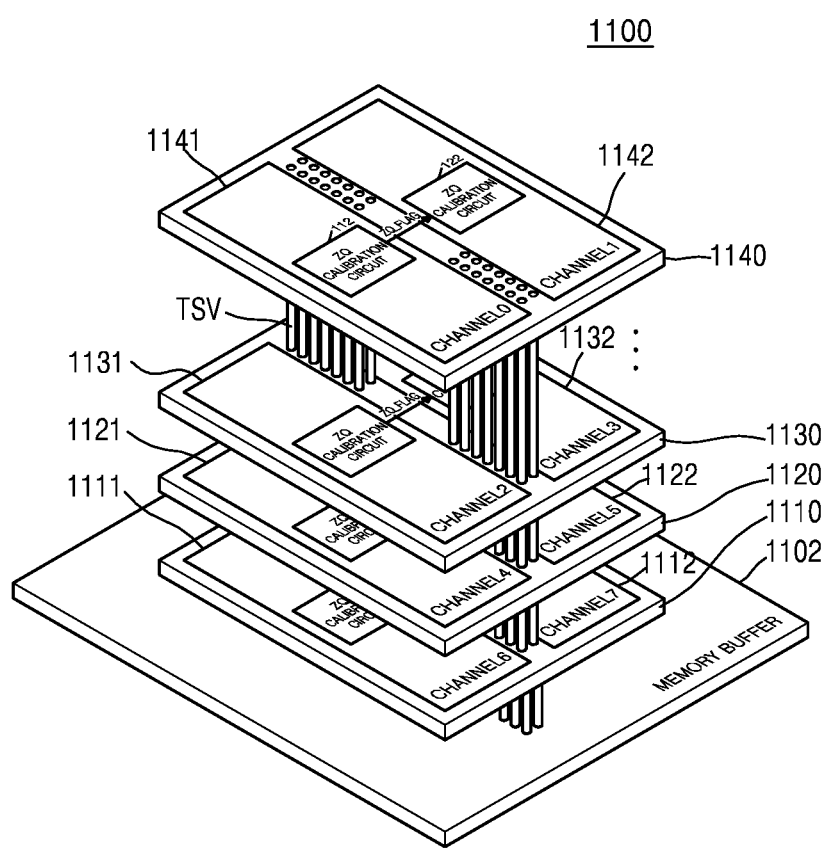
FIG. 11 is a diagram for explaining a multichip package performing a ZQ calibration method according example embodiments.

FIG. 11 is a diagram for explaining a multichip package 1100 performing a ZQ calibration method according to example embodiments. A multichip package refers to a semiconductor package in which a plurality of semiconductor chips or various types of semiconductor chips are stacked with each other so to form a package.

Referring to FIG. 11, the multichip package 1100 may include a memory buffer 1102 below memory layers 1110, 1120, 1130, and 1140 that are stacked with each other. The memory layers 1110, 1120, 1130, and 1140 may constitute a plurality of independent interfaces which are referred to channels. Each of the memory layers 1110, 1120, 1130, and 1140 may have two respective channels. For example, the memory layer 1110 may have two channels CHANNEL0 and CHANNEL1, the memory layer 1120 may have two channels CHANNEL2 and CHANNEL3, the memory layer 1130 may have two channels CHANNEL4 and CHANNEL5, the memory layer 1140 may have two channels CHANNEL6 and CHANNEL7. The memory layers 1110, 1120, 1130, and 1140 may respectively include two memory devices 1111 and 1112, 1121 and 1122, 1131 and 1132, and 1141 and 1142. The respective memory devices 1111, 1112, 1121, 1122, 1131, 1132, 1141, and 1142 may include independent memory banks, and are independently clocked. The respective memory devices 1111 and 1112, 1121 and 1122, 1131 and 1132, and 1141 and 1142 may communicate with the memory buffer 1102 through respective channels CHANNEL0 to CHANNEL7.

In the present embodiment, the multichip package 1100, in which the four memory layers 1110, 1120, 1130, and 1140 are stacked together and include the eight memory devices 1111, 1112, 1121, 1122, 1131, 1132, 1141, and 1142, is provided as an example. According to example embodiments, 2 to 8 memory layers may be stacked together in the multichip package 1100. According to example embodiments, each of the memory layers 1110, 1120, 1130, and 1140 may include 1 to 4 channels. According to example embodiments, a channel may be distributed over a plurality of memory layers 1110, 1120, 1130, and 1140.

The memory buffer 1102 may provide a signal distribution function of receiving a command, an address, a clock, and data from a memory controller, and providing the received command, address, clock, and data to the memory layers 1110, 1120, 1130, and 1140. Since the memory buffer 1102 buffers all of the command, the address, the clock, and the data, the memory controller may interface with the memory layers 1110, 1120, 1130, and 1140 by driving only load of the memory buffer 1102.

The memory buffer 1102 and the memory layers 1110, 1120, 1130, and 1140 may transceive a signal with each other via through-silicon vias (TSVs). The memory buffer 1102 may communicate with the memory controller via a conductive element formed on an outer surface of the multichip package 1100, for example, solder balls.

The two respective memory devices 1111 and 1112, 1121 and 1122, 1131 and 1132, and 1141 and 1142 of the memory layers 1110, 1120, 1130, and 1140 may share one ZQ resistor and include the ZQ calibration circuits 112 and 122 performing a ZQ calibration operation described herein. For example, the two memory devices 1141 and 1142 of the memory layer 1140 may share the ZQ resistor. The first memory device 1141 may include the ZQ calibration circuit 112 that performs a pull-down calibration operation using the ZQ resistor in response to a ZQ calibration command transmitted via through silicon vias TSVs from the memory buffer 1102, generates the ZQ flag signal ZQ_FLAG after ending the pull-down calibration operation, and performs a pull-up calibration operation. The second memory device 1142 may include the ZQ calibration circuit 122 that performs the pull-down calibration operation during the pull-up calibration operation of the first memory device 1141 in response to the ZQ flag signal ZQ_FLAG, and, after ending the pull-down calibration operation, and performs the pull-up calibration operation.

Figure 12:
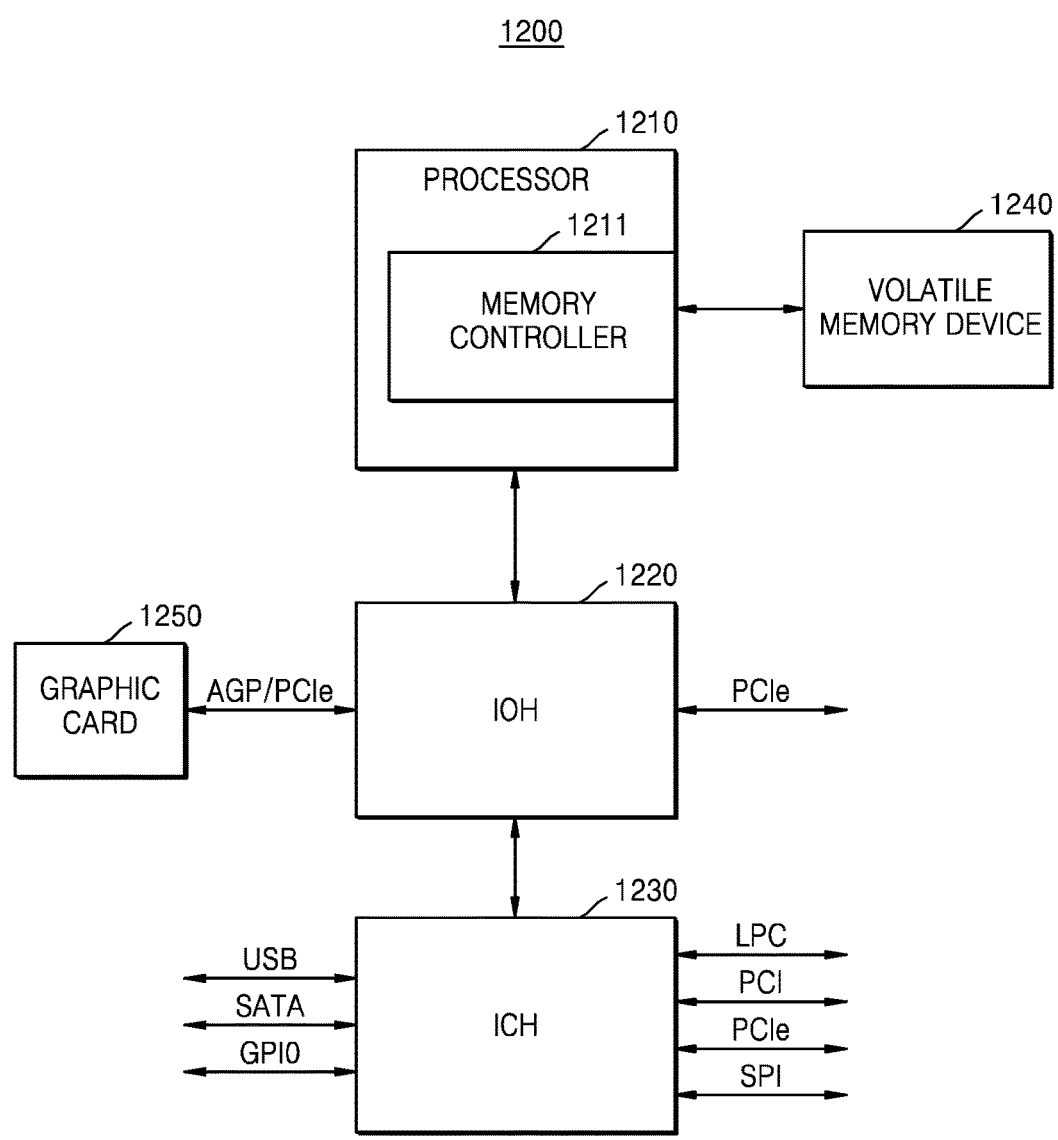
FIG. 12 is a block diagram showing an example of a computing system applied to a memory device performing a ZQ calibration method according to example embodiments.

FIG. 12 is a block diagram showing an example of a computing system 1200 applied to a memory device performing a ZQ calibration method according to example embodiments.

Referring to FIG. 12, the computing system 1200 includes a processor 1210, an input/output hub 1220, an input/output controller hub 1230, a volatile memory device 1240, and a graphic card 1250. According to embodiments, the computing system 1200 may be an arbitrary computing system such as a personal computer (PC), a server computer, a workstation, a laptop computer, a mobile phone, a smartphone, a personal digital assistant (PDA), a portable multimedia player (PMP), a digital camera, a digital TV, a set-top box, a music player, a portable game console, a navigation system, or the like.

The processor 1210 may perform various computing functions such as particular calculation or tasks. For example, the processor 1210 may be a microprocessor or a central processing unit (CPU). According to embodiments, the processor 1210 may include a single core or multiple cores. For example, the processor 1210 may include a dual-core, quad-core, or hexa-core processor. FIG. 12 shows the computing system 1200 that includes a processor 1210. However, according to embodiments, the computing system 1200 may include a plurality of processors. Also, according to embodiments, the processor 1210 may further include a cache memory located inside or outside the processor 1210.

The processor 1210 may include a memory controller 1211 for controlling an operation of the memory device 1240. The memory controller 1211 included in the processor 1210 may be referred to as an integrated memory controller (IMC). According to embodiments, the memory controller 1211 may be located in the input/output hub 1220. The input/output hub 1220 that includes the memory controller 1011 may be referred to as a memory controller hub (MCH).

The volatile memory device 1240 may be the multichannel memory device or the multichip package disclosed herein. The volatile memory device 1240 may be a multichannel memory device including a first die and a second die that share a ZQ resistor. The multichannel memory device, in the first die, may perform a pull-down calibration operation using a resistor in response to a ZQ calibration command applied from outside, after ending the pull-down calibration operation, generate a ZQ flag signal, and perform a pull-up calibration operation. The multichannel memory device, in the second die, may perform a pull-down calibration operation during the pull-up calibration operation of the first die in response to the ZQ flag signal, and, after ending the pull-down calibration operation of the second die, perform a pull-up calibration operation of the second die.

The input/output hub 1220 may manage data transmission between the processor 1210 and devices such as the graphic card 1250. For example, the input/output hub 1220 and the processor 1210 may be connected to each other via various standards of interfaces such as a front side bus (FSB), a system bus, HyperTransport, lightning data transport (LDT), quickpath interconnect (QPI), a common system interface, peripheral component interfaceExpress (CSI), or the like. FIG. 12 shows the computing system 1200 that includes the input/output hub 1220. However, the computing system 1200 may include a plurality of input/output hubs.

The input/output hub 1220 may provide various interfaces with devices. For example, the input/output hub 1220 may provide an accelerated graphics port (AGP) interface, peripheral component interface-express (PCIe), a communications streaming architecture (CSA) interface, or the like.

The graphic card 1250 may be connected to the input/output hub 1220 via an AGP or PCIe. The graphic card 1250 may control a display device (not shown) for displaying an image. The graphic card 1250 may include an internal processor and an internal semiconductor memory device for processing image data. According to embodiments, the input/output hub 1220 may include a graphics device in the input/output hub 1220 instead of the graphics card 1250, or may include a graphics device in the input/output hub 1220 in addition to the graphics card 1250 that is located outside the input/output hub 1220. The graphic device included in the input/output hub 1250 may be referred to as integrated graphics. Additionally, the input/output hub 1220 that includes a memory controller and a graphics device may be referred to as a graphics and memory controller hub (GMCH).

The input/output controller hub 1230 may perform data buffering and interface mediation so that various system interfaces may efficiently operate. The input/output controller hub 1230 may be connected to the input/output hub 1220 via an internal bus. For example, the input/output hub 1220 and the input/output controller hub 1230 may be connected to each other via a direct media interface (DMI), a hub interface, an enterprise southbridge interface (ESI), PCIe, or the like.

The input/output controller hub 1230 may provide various interfaces with peripheral devices. For example, the input/output controller hub 1230 may provide a USB port, a serial advanced technology attachment (SATA) port, a general purpose input/output (GPIO), a low pin count (LPC) bus, a serial peripheral interface (SPI), PCI, PCIe, or the like.

According to example embodiments, two or more elements, from among the processor 1210, the input/output hub 1220, and the input/output controller hub 1230, may be implemented as a chipset.

Figure 13:
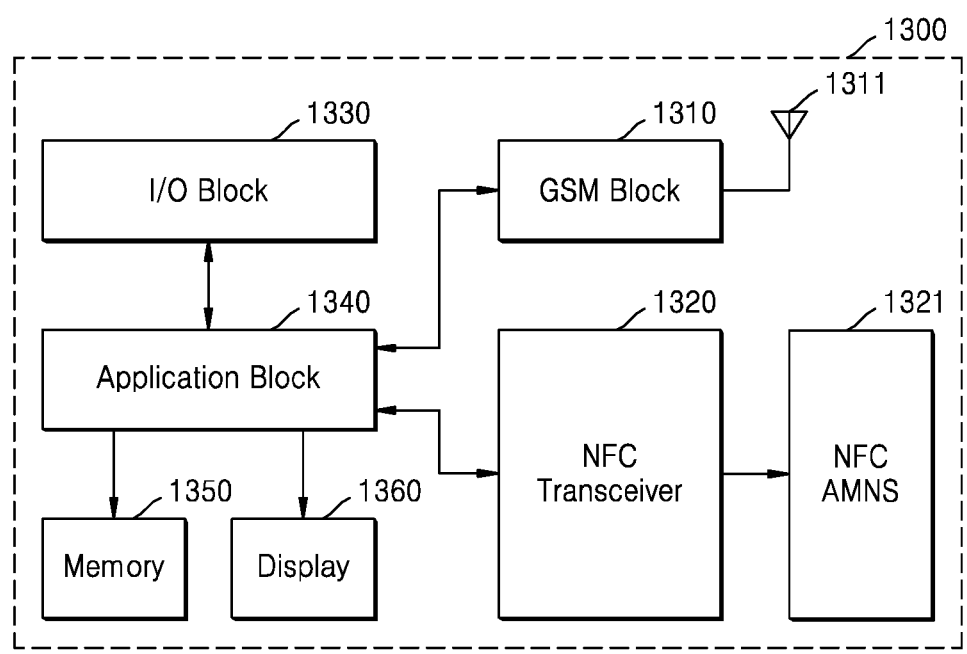
FIG. 13 is a block diagram showing an example of a mobile device applied to a memory device performing a ZQ calibration method according to example embodiments.

FIG. 13 is a block diagram showing an example of a mobile device 1300 applied to a memory device performing a ZQ calibration method according to example embodiments. The mobile device may be a mobile phone or a smart phone.

Referring to FIG. 13, the mobile device 1300 may include a global system for mobile communication (GSM) block 1310, an NFC transceiver 1320, an input/output block 1330, an application block 1340, a memory 1350, and a display 1360. FIG. 13 illustrates an example of components/blocks of the mobile device 1300. The mobile device 1300 may include more or less components/blocks. Also, although a GSM technology is used in the present embodiment, the mobile device 1300 may be implemented by using different technologies such as a code division multiple access (CDMA). The blocks of FIG. 13 may be implemented in an integrated circuit form. Alternatively, some of the blocks may be implemented in the integrated circuit form, whereas others may be implemented in a separate form.

The GSM block 1310 may be connected to an antenna 1311 and may operate to provide a wireless phone operation through a known scheme. The GSM block 1310 may include a receiver and a transmitter to perform reception and transmission operations.

The NFC transceiver 1320 may be configured to transmit and receive NFC signals by using inductive coupling for wireless communication. The NFC transceiver 1320 may provide the NFC signals to an NFC antenna matching network system 1321. The NFC antenna matching network system 1321 may transmit the NFC signal through inductive coupling. The NFC antenna matching network system 1321 may receive NFC signals provided from another NFC device and provide the received NFC signals to the NFC transceiver 1320.

The NFC transceiver 1320 may transmit and receive the NFC signals in a time serial scheme. Thus, a time section through which the NFC transceiver 1320 transmits the NFC signals is referred to as a "transmission section" and an operation mode corresponding to the NFC transceiver 1320 may be regarded as a "transmission mode" or an "NFC reader transmission mode". Likewise, a time section through which the NFC transceiver 1320 receives the NFC signals is referred to as a "reception section" and an operation mode corresponding to the NFC transceiver 1320 may be regarded as a "reception mode" or an "NFC reader reception mode".

The NFC transceiver 1320 may operate consistently with rules described in an NFC interface, a protocol-1 NFCIP-1, an NFC interface and a protocol-2 NFCIP-2 and standardized in ECMA-340, ISO/IEC 18092, ETSI TS 102 190, ISO 21481, ECMA 352, ETSI TS 102 312, etc.

The application block 1340 may include hardware circuits, for example, one or more processors, and operate to provide various user applications provided by the mobile device 1300. The user applications may include voice call operations, data transmission, data swap, etc. The application block 1340 may operate with the GSM block 1310 and/or the NFC transceiver 1320 to provide operation characteristics of the GSM block 1310 and/or the NFC transceiver 1320. Alternatively, the application block 1340 may include a program for a mobile point of sales (POS). The program may provide credit card purchase and payment functions using a mobile phone, i.e. a smart phone.

The display 1360 may display an image in response to display signals received from the application block 1340. The image may be provided by the application block 1340 or generated by a camera included in the mobile device 1300. The display 1360 may include a frame buffer to temporarily store pixel values and may be configured as a liquid crystal display screen with related control circuits.

The input/output block 1330 may provide an input function to a user and provide outputs that are to be received through the application block 1340.

The memory 1350 may store program (commands) and/or data that are to be used by the application block 1340 and may be implemented as RAM, ROM, flash memory, etc. Thus, the memory 1350 may include at least one of volatile and non-volatile storage devices. For example, the memory 1350 may correspond to the multichannel memory devices 100 and 700 of FIGS. 1 and 7.

The memory 1350 may be a multichannel memory device including a first die and a second die that share a ZQ resistor. The multichannel memory device, in the first die, may perform a pull-down calibration operation using a resistor in response to a ZQ calibration command applied from outside of the memory 1350, after ending the pull-down calibration operation, generate a ZQ flag signal, and perform a pull-up calibration operation. The multichannel memory device, in the second die, may perform a pull-down calibration operation during the pull-up calibration operation of the first die in response to the ZQ flag signal, and, after ending the pull-down calibration operation, perform a pull-up calibration operation.

While the inventive concept has been particularly shown and described with reference to embodiments thereof, it will be understood that various changes in form and details may be made therein without departing from the spirit and scope of the following claims.

What is claimed is:

1. An output impedance control (ZQ) calibration method performed by a memory device comprising a first die and a second die that share a resistor connected to a ZQ pin, the ZQ calibration method comprising:
    performing a first calibration operation for the first die using the resistor in response to a ZQ calibration command applied from outside of the memory device;
    after the first calibration operation of the first die ends, generating a ZQ flag signal from the first die and performing a second calibration operation of the first die;
    performing a first calibration operation of the second die using the resistor in response to the ZQ flag signal; and
    after the first calibration operation of the second die ends, performing a second calibration of the second die,
    wherein the first calibration operation of each of the first and second dies is one of a pull-up calibration operation which generates a pull-up calibration code and a pull-down calibration operation which generates a pull-down calibration code, used to adjust a termination resistance value of each of the first and second dies, and wherein the second calibration operation of each of the first and second dies is the other one of the pull-up calibration operation and the pull-down calibration operation.

2. The ZQ calibration method of claim 1, wherein the second calibration operation of the first die and the first calibration operation of the second die overlap during a period of time.

3. The ZQ calibration method of claim 1, wherein the second calibration operation of the first die starts before the first calibration operation of the second die starts.

4. The ZQ calibration method of claim 1, further comprising:

transmitting the ZQ flag signal to the second die through a wired interconnection between the first die and the second die.

5. The ZQ calibration method of claim 1, further comprising:

packaging the resistor with the first die and the second die into the memory device.

6. A memory device comprising:

a resistor;

a first die comprising a first pad connected to the resistor, the first die configured to perform a first calibration operation using the resistor in response to an output impedance control (ZQ) calibration command, generate a ZQ flag signal when the first calibration operation is performed, and additionally perform a second calibration operation of the first die; and a second die comprising a second pad connected to the resistor, the second die configured to perform a first calibration operation using the resistor in response to the ZQ flag signal, and additionally perform a second calibration operation of the second die, wherein each of the first and second dies comprises an output driver, wherein the output driver comprises a pull-up driver and a pull-down driver, wherein the first calibration operation of each of the first and second dies is one of a pull-up calibration operation that provides a pull-up calibration code to the pull-up driver of each of the first and second dies and a pull-down calibration operation that provides a pull-down calibration code to the pull-down driver of each of the first and second dies, used to adjust a termination resistor of the output driver of each of the first and second dies, and wherein the second calibration operation of each of the first and second dies is the other one of the pull-up calibration operation and the pull-down calibration operation.

7. The memory device of claim 6, wherein the resistor, the first die, and the second die are packaged into the memory device.

8. The memory device of claim 6, further comprising:

a wired interconnection connected between a third pad of the first die and a fourth pad of the second die, wherein the third pad is configured to output the ZQ flag signal, and wherein the fourth pad is configured to receive the ZQ flag signal.

9. The memory device of claim 6, further comprising:

a first channel and a second channel each channel comprising signal lines transmitting a command, an address, and data to the first die and the second die, respectively, wherein the ZQ calibration command is provided through the first channel.

10. The memory device of claim 6, wherein the first die is configured to transmit the ZQ flag signal to the second die through a signal line connected between a pad of the first die and a pad of the second die.

11. The memory device of claim 6, wherein the first die is configured to perform the second calibration operation and the second die is configured to perform the first calibration operation overlapping with the second calibration operation of the first die during a period of time.

12. The memory device of claim 11, wherein the first die is configured to perform the second calibration operation before the first calibration operation of the second die starts.

13. An electronic device comprising:

a first memory device comprising a first output driver connected to a resistor, and configured to perform a calibration operation using the resistor; and a second memory device comprising a second output driver connected to the resistor, and configured to perform a calibration operation using the resistor during the calibration operation of the first memory device, wherein the first memory device is configured to adjust a resistance value of the first output driver during the calibration operation of the first memory device, wherein the second memory device is configured to adjust a resistance value of the second output driver during the calibration operation of the second memory device, wherein the first output driver includes a first pull-up driver and a first pull-down driver and the second output driver includes a second pull-up driver and a second pull-down driver, wherein the first memory device is configured to provide a first calibration code to one of the first pull-up driver and the first pull-down driver of the first output driver during a first calibration operation of the first memory device, and provide a second calibration code to the other one of the first pull-up driver and the first pull-down driver of the first output driver during a second calibration operation of the first memory device later the first calibration operation, wherein the second memory device is configured to provide a third calibration code to one of the second pull-up driver and the second pull-down driver of the second output driver during a third calibration operation of the second memory device, and provide a fourth calibration code to the other one of the second pull-up driver and the second pull-down driver of the second output driver during a fourth calibration operation of the second memory device later the third calibration operation, and wherein the second calibration operation and the third calibration operation overlap during a period of time.

14. The electronic device of claim 13, wherein the first memory device is configured to perform the second calibration operation before the third calibration operation of the second memory device starts.

15. The electronic device of claim 13, wherein the first memory device is configured to end the second calibration operation before the fourth calibration operation of the second memory device ends.

16. The electronic device of claim 13, wherein the first memory device is configured to perform the first calibration operation in response to an output impedance control (ZQ) calibration command applied from an external device, and generate a ZQ flag signal when the first calibration operation ends, and wherein the second memory device is configured to perform the third calibration operation in response to the ZQ flag signal.

\* \* \* \* \*